US009417282B2

(12) United States Patent
Daveau et al.

(10) Patent No.: US 9,417,282 B2
(45) Date of Patent: Aug. 16, 2016

(54) METHOD FOR MANAGING THE OPERATION OF A CIRCUIT WITH TRIPLE MODULAR REDUNDANCY AND ASSOCIATED DEVICE

(71) Applicant: STMICROELECTRONICS (CROLLES 2) SAS, Crolles (FR)

(72) Inventors: Jean-Marc Daveau, Grenoble (FR); Sylvain Clerc, Grenoble (FR); Philippe Roche, Biviers (FR)

(73) Assignee: STMICROELECTRONICS (CROLLES 2) SAS, Crolles (FR)

( * ) Notice: Subject to any disclaimer, the term of this patent is extended or adjusted under 35 U.S.C. 154(b) by 27 days.

(21) Appl. No.: 14/662,530

(22) Filed: Mar. 19, 2015

(65) Prior Publication Data

US 2015/0377962 A1  Dec. 31, 2015

(30) Foreign Application Priority Data

Jun. 27, 2014  (FR) ..................................... 14 56023

(51) Int. Cl.
| G06F 11/08 | (2006.01) |
| G01R 31/3177 | (2006.01) |
| G06F 11/267 | (2006.01) |
| G01R 31/3185 | (2006.01) |
| G06F 11/18 | (2006.01) |

(52) U.S. Cl.
CPC .......... G01R 31/3177 (2013.01); G06F 11/267 (2013.01); *G01R 31/318502* (2013.01); *G06F 11/183* (2013.01)

(58) Field of Classification Search
CPC ................... G01R 31/3177; G01R 31/318502; G06F 11/267; G06F 11/183
See application file for complete search history.

(56) References Cited

U.S. PATENT DOCUMENTS

| 2002/0013928 | A1 | 1/2002 | Waldie et al. |
| 2007/0028157 | A1 | 2/2007 | Drake et al. |
| 2007/0262787 | A1* | 11/2007 | Chakraborty ........ H03K 3/0375 326/16 |
| 2011/0022909 | A1 | 1/2011 | Wang et al. |

FOREIGN PATENT DOCUMENTS

WO       2008/042138       4/2008

* cited by examiner

*Primary Examiner* — Sam Rizk
(74) *Attorney, Agent, or Firm* — Allen, Dyer, Doppelt, Milbrath & Gilchrist, P.A.

(57) ABSTRACT

A method for managing operation of a logic component is provided, with the logic component including a majority vote circuit and an odd number of flip-flops equal to at least three. The method includes, following a normal operating mode of the logic component, placing a flip-flop in a test mode, and injecting a test signal into a test input of the flip-flop being tested while a logic state of the other flip-flops is frozen. A test signal output is analyzed. At the end of the test, the logic component is placed back in the normal operating mode. The majority vote circuit restores a value of the output signal from the logic component that existed prior to initiation of the test.

16 Claims, 4 Drawing Sheets

METHOD FOR MANAGING THE OPERATION OF A CIRCUIT WITH TRIPLE MODULAR REDUNDANCY AND ASSOCIATED DEVICE

FIELD OF THE INVENTION

Various embodiments of the invention and their implementation relate to the operation of replicated electronic components forming a circuit with triple modular redundancy (TMR), and more particularly, to the operation of an assembly of replicated electronic components for the implementation of fault detection.

BACKGROUND

The impact of a particle on a transistor or near a transistor may lead to a parasitic current in an integrated circuit. This impact depends on the ionizing power of the particle, which may be characterized by its linear energy transfer (LET), for example. The quantity of charge generated by a particle corresponds to that implemented during the change of state of a logic node controlled by a transistor. The consequence of this impact may be a change of state or levels of the logic signals, and as a consequence, may lead to errors at the output of the circuit.

To overcome such errors, a known approach is to replicate the signals by replicating the circuits generating such signals. This redundancy allows the probability of obtaining an erroneous signal at the output to be reduced. The probability that all the replicated signals coming from the same signal are all modified at the same time (all the circuits generating these signals are simultaneously subjected to a radiation interference), is much lower than the probability of a non-replicated signal being affected by external radiation. In this way, an analysis of the replicated signals at the output allows the value without interference to be recovered in a more certain manner.

Some sectors of activity, such the aerospace or medical sector, need a component robustness allowing a reliability of response close to 100%. This characteristic is more important than other factors.

One known method of replication allowing such a level of reliability to be obtained at a low physical and financial cost includes triplicating the signals. In other words, three identical electronic components receive the same data signal at the input, and use a majority vote circuit at the output to determine the output signal. These redundant circuits using majority voting are referred to as triple modular redundancy (TMR).

To monitor the state of the electronic components, notably of an integrated circuit, a known technique is to perform a test using an automatic test pattern generator (ATPG) at the output of an integrated circuit production line, and/or, in certain cases, built-in self-tests, during operation of the circuit. Built-in self-tests are referred to as Logic Built-In Self-Test (LBIST).

An ATPG is a test method assisted by a computer used for finding a test sequence at the input which, when it is applied to an integrated circuit, allows test equipment external to the integrated circuit to distinguish between a normal behavior and a defective behavior of the electronic circuit being tested. The test sequences generated are used for testing semiconductor devices at the end of the production line, prior to any use.

A built-in self-test (BIST) method is a mechanism allowing a hardware or software system, or both, to perform its own diagnostic in an autonomous manner. The diagnostic can be triggered automatically, for example, at regular intervals or every time the integrated circuit is powered-up. This may be by triggering a self-monitoring circuit. Otherwise, the diagnostic is in a continuous manner. This mechanism is often found in integrated circuits because it allows the verification of the circuit to be automated.

The test of the LBIST type is a form of a BIST test in which the integrated circuits are configured so as to be capable of carrying out their own operational test, without assistance by a computer or any other external equipment.

The test of the LBIST type offers the advantage of enabling internal electronic circuits to be tested that do not have external connection terminals allowing a direct connection of the circuit to an external automated system, such as an ATPG. It also offers the advantage of being able to trigger a test phase at any given moment in time during the life of the integrated circuit.

The principle of an LBIST test is also based on the generation of at least one test sequence to be injected into the electronic components to be tested, and the analysis of the signal obtained at the output of the components in response to the injected test sequence.

The major drawback is that, when an LBIST test phase is triggered during the operation, the information contained in each of the electronic components is lost. As a consequence, the integrated circuit cannot continue with its operation following the test in exactly the state in which it was prior to the test.

SUMMARY

According to one embodiment and its implementation, a method and an architecture are provided for managing the operation of a component or logic circuit of the triple modular redundancy (TMR) type allowing a test phase to be carried out during operation of the integrated circuit, and at the end of the test phase, the logic component is to be put back into the state in which it was prior to the test phase.

According to one aspect, a method for managing the operation of a logic component may comprise a majority vote circuit, and an odd number of flip-flops at least equal to three. Each flip-flop may have a data input, a test input, a test output and a data output connected to an input of the majority vote circuit. The method may comprise placing the logic component into a normal mode of operation in which the same input signal is delivered onto each data input, and the majority vote circuit delivers an output signal.

According to one general feature of this aspect, the method may comprise, following a normal mode of operation, placing the component into a test mode in which a flip-flop of the logic component is placed into the test mode. This may be, for example, by injecting a non-zero test control signal into a test control input of the flip-flop. A test signal may be injected into the test input of the flip-flop being tested. The logic state of the other flip-flops may be frozen. The output signal delivered by the test output of the flip-flop being tested may be analyzed. At the end of the test phase, the logic component is put back into a normal mode of operation. The majority vote circuit may automatically restore the value of the output signal on the data output of the logic component that existed prior to the initiation of the test mode.

A flip-flop of the logic component may be tested by injecting the test signal only into this flip-flop of the logic component, and by freezing the logic state of the other flip-flops.

The state of the other flip-flops may be frozen by not enabling, in other words, by not operating the other flip-flops during the test phase. For this purpose, the clocks of the flip-flops of a logic component may be dissociated. This allows the clocks of the flip-flops not being tested to not be enabled, and thus, their state is frozen when the other flip-flops are being tested.

The restoration of the preceding state of the logic component may be automatic when the normal operation of the logic component is re-established given that the other flip-flops, which are in a numerical majority with respect to the sole flip-flop being tested, have conserved the state preceding the test phase. Following the first clock edge after the re-establishment of the normal operation of the logic component, the majority vote circuit may therefore deliver a signal at the output corresponding to the state of the logic component prior to the test phase being initiated.

After having frozen the logic state of the other flip-flops and before analyzing the output signal delivered by the test output, the flip-flop being tested may advantageously be reset into a normal operating mode, for example, by injecting a zero test control signal into its test control input. The logic component may be controlled so that the output signal of the flip-flop being tested is delivered at the output of the logic component for the purposes of testing an additional logic circuit connected to the output of the logic component. The flip-flop being tested may be reset into the test mode, for example, by injecting a non-zero test control signal into its test control input.

It may thus be possible to propagate the test signal through an additional logic circuit, also denoted by those skilled in the art as a logic cone. The additional logic circuit may generally comprise an assembly of logic blocks, and may be coupled to the output of the logic component being tested. The propagation of this test signal through the logic cone may allow, in the case where the output of the logic cone may be coupled to at least one other logic component being tested, the correct operation of the logic blocks of the logic cone to be tested.

A clock cycle may also be applied to the flip-flop being tested, after the control of the logic component and before resetting the flip-flop being tested into the test mode.

Preferably, the above steps are iterated for another flip-flop of the logic component until all the flip-flops of the logic component have been tested.

In the case of a TMR, the test phase may be repeated three times followed by the restoration phase in each test phase changing the flip-flop in which the test signal is injected. In this way, there may always be a majority of flip-flops, including the other two flip-flops, having the state preceding the test phase in such a manner as to restore the preceding state of the TMR at the end of each test phase. Each of the flip-flops may be tested.

Advantageously, the method may further comprise, before any of the logic components are placed into a normal operating mode, placing the logic component into an initial test mode in which the flip-flops of the logic component are coupled in series via their test input and their respective test output in such a manner as to form a test chain of flip-flops comprising a test chain input and a test chain output. A test signal may be injected into the test chain input, and the test output signals delivered by the test chain output may be analyzed.

The initial test mode may allow an initial test to be carried out at the end of the production line using an ATPG. The flip-flops may be conventionally concatenated between their test input and their test output for implementing such a fault detection.

According to another aspect, an electronic device may comprise a logic component comprising a majority vote circuit and an odd number of flip-flops equal to at least three. Each flip-flop may have a data input, a test input, a test output and a data output connected to an input of the majority vote circuit. The device may comprise a control circuit configured for placing the component into a normal operating mode in which the same input signal is delivered to each data input, and the majority vote circuit may deliver an output signal.

According to a general feature of this aspect, the control circuit may be further configured, following a normal operating mode, for placing the logic component into a test mode in which a flip-flop of the logic component is placed into a test mode, for example, by injecting a non-zero test control signal into its test control input. A test signal may be injected into the test input of the flip-flop being tested. The logic state of the other flip-flops may be frozen, and the test output signal of the flip-flop being tested may be analyzed. At the end of the test phase, the logic component may be reset back into a normal operating mode. The majority vote circuit may automatically restore the value of the output signal that existed prior to the initiation of the test mode onto the data output of the logic component.

Preferably, the control circuit may comprise a first multiplexer receiving at its input the test output signals from the flip-flops of the logic component. The first multiplexer may thus allow the selection of the output signal to be delivered so as to transmit the signal coming from the test output of the flip-flop being tested, and thus form a test chain between various similar logic components.

The test chain thus created may allow the sequence of test bits to be transmitted through the various concatenated logic components such that, at the end of the injection of a sequence of test bits, each flip-flop being tested of each logic component of the test chain may be in a pre-determined state for the test.

The control circuit may also comprise a second multiplexer receiving at its input the data output signals from the flip-flops of the logic component and the output signal from the majority vote circuit. The second multiplexer may thus allow either the signal coming from the majority vote circuit when the logic component is in normal operating mode, or the output signal from the flip-flop being tested to be transmitted. It is thus possible to transmit, during a test phase, the output signal from the flip-flop being tested to additional logic circuits coupled to the output, In the case where additional logic circuits are coupled at the output to a logic component in test mode, it may be possible to further detect a potential fault condition of one of the additional logic circuits coupled between two logic components being tested.

Advantageously, the control circuit may be further configured for, prior to placing any of the logic component into a normal operating mode, placing the logic component into an initial test mode in which the flip-flops of the logic component are coupled in series via their respective test input and test output so as to form a test chain of flip-flops comprising a test chain input and a test chain output. A test signal may be injected into the test chain input, and the test output signals delivered by the test chain output may be analyzed.

For this purpose, the control circuit may further comprise, for placing the logic component into the initial test mode or else into the test mode, an additional multiplexer for each of the flip-flops of the logic component starting from the second flip-flop. Each additional multiplexer may receive at its input the test signal and the test output signal from a flip-flop. The test output of each flip-flop being coupled to the test input of a flip-flop distinct from the flip-flop coupled to its input is such that the flip-flops of the same logic circuit may be coupled in series via their respective test input and test output.

Each additional multiplexer may allow either directly the test signal or the test output signal from a flip-flop to be selected depending on whether the test carried out is respectively a test in the course of operation, or else an initial test using an ATPG.

In one embodiment, the logic component may comprise three flip-flops to form a TMR.

BRIEF DESCRIPTION OF THE DRAWINGS

Other advantages and features of the invention will become apparent upon examining the detailed description of one embodiment and its implementation, which are non-limiting, and the appended drawings in which.

DETAILED DESCRIPTION

Figure 1:
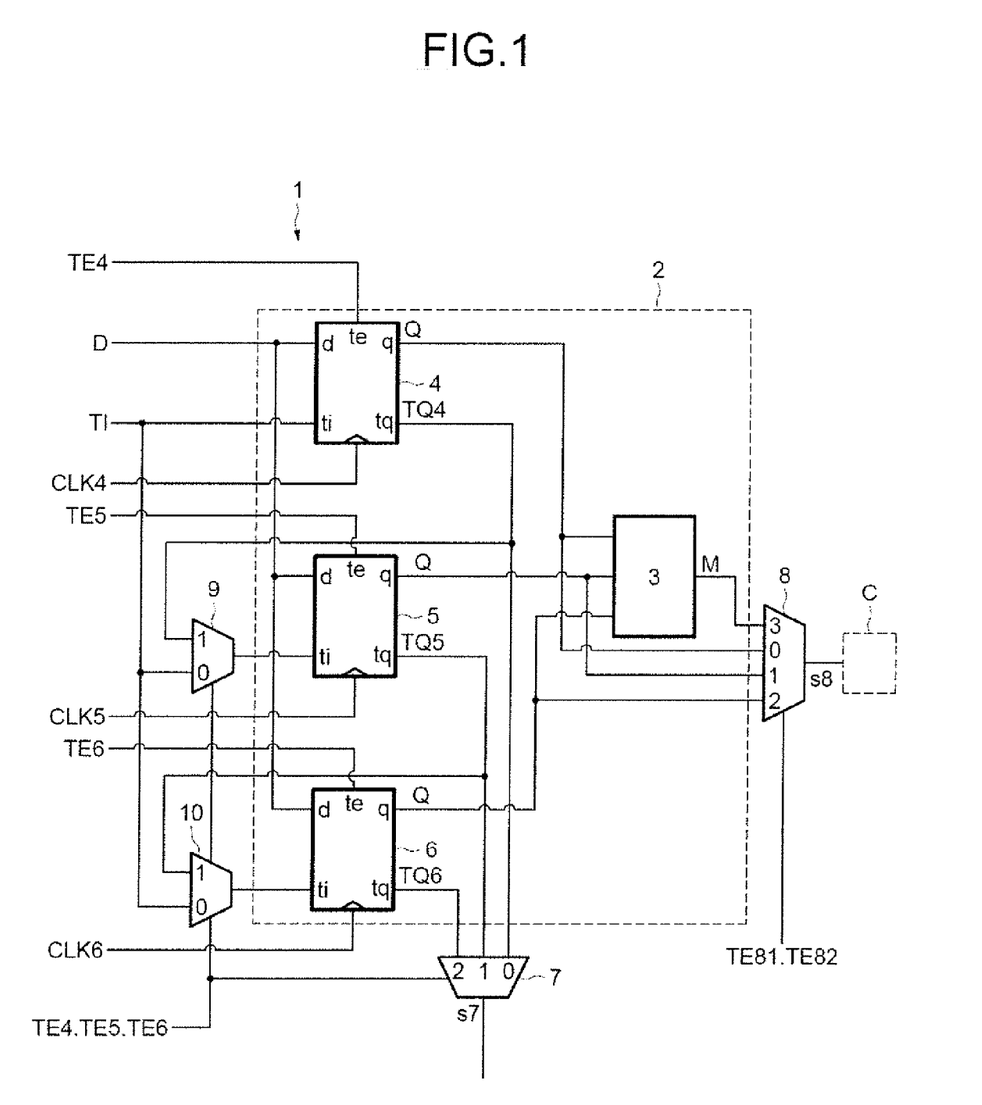
FIG. 1 shows an electronic device according to one embodiment.

FIG. 1 shows schematically an electronic device 1 comprising a logic component 2 according to one embodiment. The logic component 2 is a triple modular redundancy (TMR) comprising a majority vote circuit 3, together with first, second and third flip-flops respectively referenced 4, 5 and 6.

Each flip-flop 4 to 6 comprises a data input d receiving the same data signal D, and a data output q designed to deliver an output signal Q. The data output q of each flip-flop 4 to 6 is connected to an input of the majority vote circuit 3.

Each flip-flop 4 to 6 includes a clock input respectively denoted CLK4, CLK5 and CLK6. The operation of the three flip-flops 4 to 6 is regulated by the frequency of the three clocks CLK4 to CLK6. In a normal operating mode, the flip-flops 4 to 6 operate by copying the data signal D at the input onto their data output q at each clock edge. The output signal Q therefore normally corresponds to the data signal D at the end of the rising clock edge.

Each flip-flop 4 to 6 furthermore comprises a test input ti designed to receive a test signal TI or TQ4 or TQ5, depending on the test mode, a test output tq designed to deliver a resulting test signal TQ4 to TQ6, and a test mode control input to designed to receive a test control signal TE4 to TE6 to enable the test mode of the flip-flop.

In the test operating mode, a test sequence is first loaded. During the loading, the flip-flops operate by copying the test signal TI at the test input ti onto the test output tq at each rising edge of their clock. After the loading, the test output tq delivers a resulting signal TQ at the output whose value corresponds to the test signal TI at the end of the rising clock edge.

It should be noted that, in this mode, the output q also copies the input ti so as to be able to apply the test sequence to an additional logic circuit C, also known as logic cone, comprising one or more logic modules, potentially connected to the output of the flip-flop at the output q.

The majority vote circuit 3 comprises a number of inputs corresponding to the number of flip-flops of the logic component 2. In the example illustrated in FIG. 1, the majority vote circuit 3, also known as a voter, comprises three inputs respectively coupled to the data outputs q of the three flip-flops 4 to 6.

The voter 3 delivers an output signal M at the output corresponding to the majority binary value from among its inputs. The voter 3 thus delivers an output signal M of high value equal to one when at least two signals out of three at the input have a high value, or else an output signal M of low value equal to zero when at least two signals out of three at the input of the voter 3 have a low value.

The device 1 comprises a control circuit configured for placing the TMR 2 in a normal operating mode or in a test mode, or else in an initial test mode.

The control circuit comprises a circuit for controlling the flip-flops 4 to 6 designed to inject a control signal TE4 to TE6 for the test mode into each of the flip-flops 4 to 6. The flip-flop control circuit is coupled to each of the control inputs to of the three flip-flops 4 to 6 of the TMR 2 and delivers a specific control signal TE4 to TE6 for each flip-flop 4 to 6.

When the first control signal TE4 is non-zero, the first flip-flop 4 is placed in the test mode, and when the first control signal TE4 is zero, the first flip-flop 4 is placed in the normal operating mode. In an analogous manner, when the second control signal TE5 is non-zero, the second flip-flop 5 is placed in the test mode, and when it is zero, the second flip-flop 5 is placed in the normal operating mode, and when the third control signal TE6 is non-zero, the third flip-flop 6 is placed in the test mode, and when it is zero, the third flip-flop 6 is placed in the normal operating mode.

The control circuit furthermore comprises a first multiplexer 7 and a second multiplexer 8. The first multiplexer 7 comprises three inputs respectively coupled to the test output tq of each of the three flip-flops 4 to 6 of the TMR 2. The first multiplexer 7 comprises an output s7 designed to deliver at the output one of the three signals received at the input depending the control signal received.

The second multiplexer 8 comprises four inputs. The first input is coupled to the output of the voter 3 and receives the output signal M from the voter 3. The three other inputs are respectively coupled to the data output q of each of the three flip-flops 4 to 6 of the TMR 2. The second multiplexer 8 comprises an output s8 designed to deliver, at the output, one of the four signals received at the input depending on the control signal received.

The first multiplexer 7 comprises a control input receiving a control signal TE4.TE5.TE6 corresponding to a combination of the binary control signals TE4 to TE6 for the test mode of the flip-flops 4 to 6. The control signal allows it to be defined which signal is transmitted by the first multiplexer 7 according to the mode in which the TMR 2 is set. TABLE 1 supplies the values of the output signal S7 of the first multiplexer 7 as a function of the values of the control signals TE4 to TE6:

TABLE 1

| TE4 | TE5 | TE6 | S7 |
|---|---|---|---|
| 1 | 0 | 0 | 0 (TQ4) |
| 0 | 1 | 0 | 1 (TQ5) |
| 0 | 0 | 1 | 2 (TQ6) |
| 1 | 1 | 1 | 2 (TQ6) |
| 0 | 0 | 0 | — |
| other binary combinations | | | — |

The second multiplexer 8 comprises a control input receiving a control signal TE81.TE82 which allows it to be defined which signal is transmitted by the second multiplexer 8 according to the mode in which the TMR 2 is set. TABLE 2 supplies the values of the output signal S8 of the second multiplexer 8 as a function of the values of the control signals TE81 and TE82:

TABLE 2

| TE81 | TE82 | S8 |
|---|---|---|
| 0 | 0 | 0 (Q4) |
| 0 | 1 | 1 (Q5) |
| 1 | 0 | 2 (Q6) |
| 1 | 1 | 3 (M) |

The control circuit furthermore comprises a circuit for injecting a test signal TI designed to define a sequence of at least one test bit to be injected into at least one flip-flop 4, 5 or 6.

The sequence of test bits comprises a number of bits corresponding to the number of TMRs concatenated in series via their test input and output ti and tq. In a case where several TMRs in the same integrated circuit are concatenated together in series via their test input and their test output, the sequence of test bits corresponds to the number of concatenated TMRs.

In order to place the TMR 2 in the initial test mode or else in the test mode, the control circuit also comprises a first additional multiplexer 9 whose output is coupled to the test input ti of the second flip-flop 5, and a second additional multiplexer 10 whose output is coupled to the test input ti of the third flip-flop 6.

The first additional multiplexer 9 comprises two inputs. The first input, denoted 0, is coupled directly to the circuit for injecting the test signal TI and the second input, denoted 1, is coupled to the test output tq of the first flip-flop 4.

The second additional multiplexer 10 also comprises two inputs. The first input, denoted 0, is coupled directly to the circuit for injecting the test signal TI and the second input, denoted 1, is coupled to the test output tq of the second flip-flop 5. The test input ti of the first flip-flop 4 is coupled solely to the circuit for injecting the test signal TI.

The first and the second additional multiplexers 9 and 10 are controlled by the same control signal, denoted by TE4.TE5.TE6. TABLE 3 supplies the values of the output signal S from the first additional multiplexer 9 as a function of the values of the control signals TE4 to TE6:

TABLE 3

| TE4 | TE5 | TE6 | S |
|---|---|---|---|
| 1 | 0 | 0 | — |
| 0 | 1 | 0 | 0 (TI) |
| 0 | 0 | 1 | — |
| 1 | 1 | 1 | 1 (TQ4) |
| 0 | 0 | 0 | — |
| other binary combinations | | | — |

TABLE 4 supplies the values of the output signal S from the second additional multiplexer 10 as a function of the values of the control signals TE4 to TE6:

TABLE 4

| TE4 | TE5 | TE6 | S |
|---|---|---|---|
| 1 | 0 | 0 | — |
| 0 | 1 | 0 | — |
| 0 | 0 | 1 | 0 (TI) |
| 1 | 1 | 1 | 1 (TQ5) |
| 0 | 0 | 0 | — |
| other binary combinations | | | — |

The control circuit is configured for enabling the various modes of operation of the TMR 2. Thus, the control circuit can switch the TMR 2 into an initial test mode directly after fabrication prior to any operation in normal mode. It can also switch the TMR 2 into a normal operating mode or else into a test mode after a normal operating mode.

Figure 2:
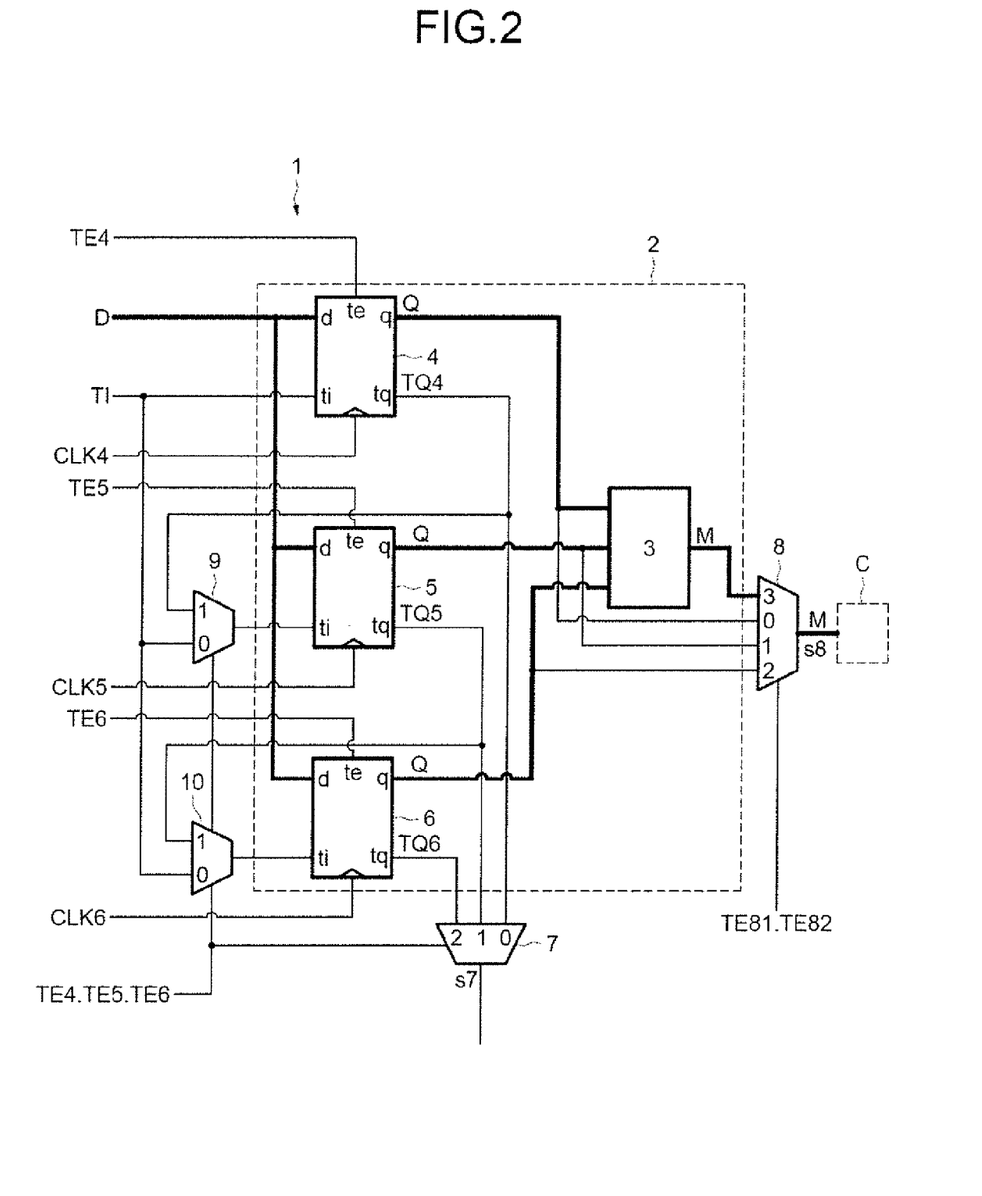
FIG. 2 illustrates the electronic device in a normal operating mode.
Figure 3:
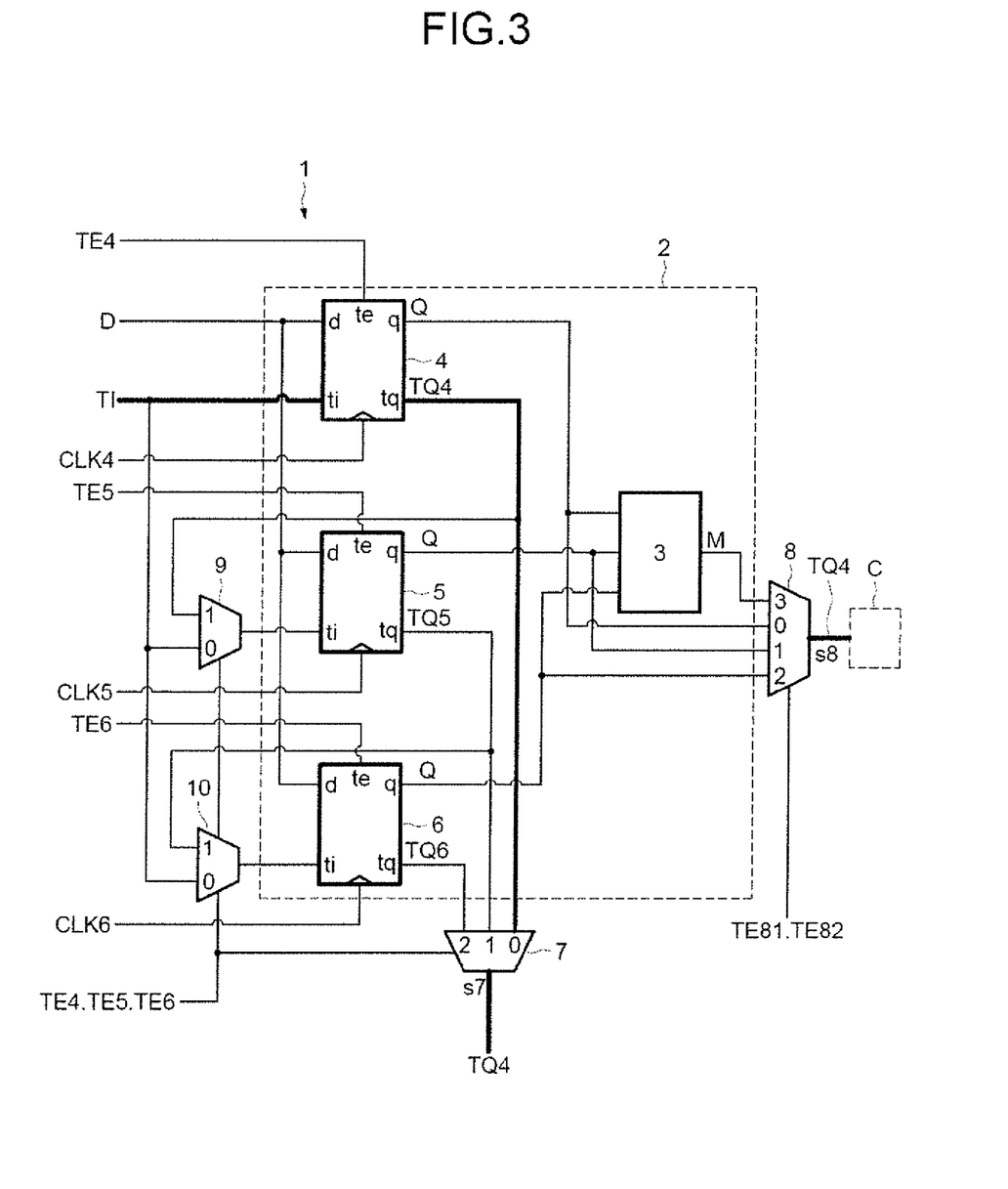
FIG. 3 illustrates the electronic device in a test mode.
Figure 4:
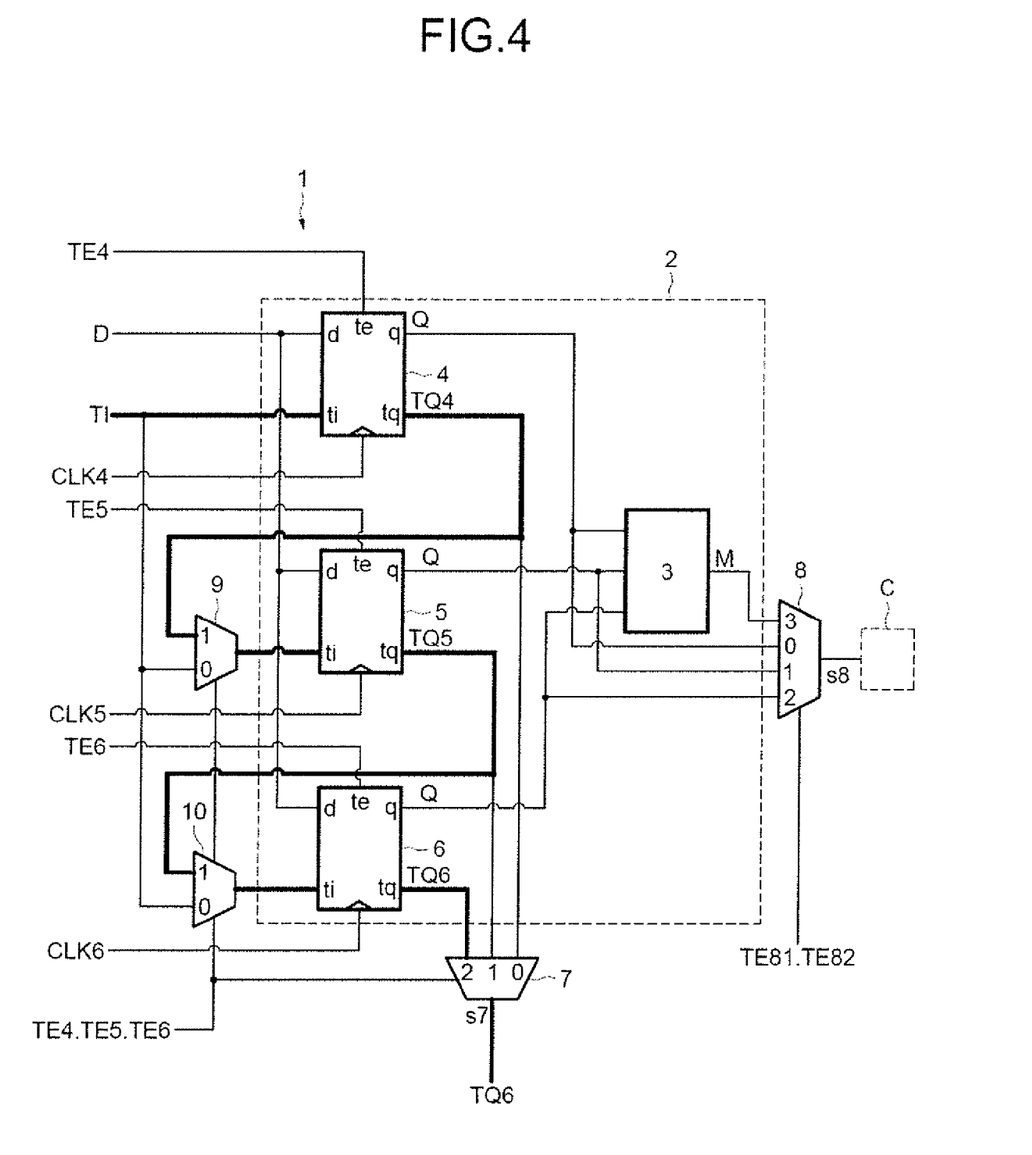
FIG. 4 illustrates the electronic device in an initial test mode.

FIGS. 2 to 4 are duplicates of FIG. 1 but identify in bold the electrical circuits implemented during the various modes of operation of the TMR 2 controlled by the control circuit of the device 1.

In FIG. 2 the device 1 for managing the operation of the TMR 2 is shown in a normal operating mode. In the normal operating mode, the same data signal D is delivered to each data input d of the three flip-flops 4 to 6.

The three clocks CLK4 to CLK6 are synchronized so as to operate simultaneously in a normal operating mode. Thus, at the next clock edge, the flip-flops 4 to 6 each copy onto the data output q the value of the data signal D at the data input d.

The data output signal Q, which therefore has the value of the data signal D initially at the input of the flip-flops 4 to 6, is received at the input of the voter 3 for each of the three flip-flops 4 to 6. The majority vote circuit 3 then delivers an output signal M at the output corresponding to the majority binary value at the input which should correspond to the value of the data signal D initially at the input of the flip-flops 4 to 6. In the case where, at the most, one of the flip-flops 4 to 6 is defective.

The second multiplexer 8 is controlled by the control circuit in such a manner as to transmit the signal received at its third input, numbered 3 in the second multiplexer 8 illustrated in the figures. In other words, this is the output signal M from the voter 3. The signal delivered at the output s8 of the second multiplexer 8 therefore corresponds, in the case where at least two of the three flip-flops are not defective, to the data output signal Q of the flip-flops 4 to 6. This is the data signal D at the input of the flip-flops 4 to 6. The data signal may thus be transmitted to one or more logic circuits forming the logic cone C.

In FIG. 3, the device 1 for managing the operation of the TMR 2 is shown in a test mode following a normal operating mode. The control circuit is configured, following a normal operating mode, for placing the TMR 2 in a test mode in which a test signal TI is injected into the test input ti of the first flip-flop 4. The first flip-flop 4 is the only flip-flop being tested in this test mode. For this purpose, the circuit for controlling the flip-flops injects the corresponding control signals TE4 to TE6 so as to place only the first flip-flop 4 in a test mode, and keep the two other flip-flops 5 and 6 in a normal operation. For this purpose, the second and third control signals TE5 and TE6 are zero, whereas the first control signal TE4 is non-zero. In the two later test modes, the second flip-flop 5 then the third flip-flop 6 will be successively tested.

In the first test mode in which the first flip-flop 4 is tested, the logic state of the second flip-flop 5 and of the third flip-flop 6 are frozen by disabling their clocks CLK5 and CLK6.

In the case where flip-flops are used comprising an enable input, the signal delivered to this input allows the operation of the flip-flop to be enabled when this signal is non-zero, or else its current state is to be frozen when this signal is zero.

The first flip-flop 4 is made to operate on a rising clock edge of its clock CLK4 so that the test output tq copies the data value on the test input ti in order to load the test value into the first flip-flop 4. Thus, at the end of the rising clock edge, if the first flip-flop is not defective, the output signal TQ4 from the first flip-flop 4 has the value of the bit of the test signal TI which there was on the test input ti prior to the rising clock edge.

It should be noted that, at the end of the clock edge, the data output Q of the first flip-flop 4 has also copied the value of the test signal TI onto the test input ti, so that the data output Q of the first flip-flop 4 no longer has the value from before the test. The flip-flop 4 is thus no longer in the same state as prior to the test.

In the test mode, the second multiplexer 8 allows the output signal Q from the flip-flop being tested, here the first flip-flop 4, to be transmitted. It is thus possible to transmit, during a test phase, the output signal from the flip-flop being tested to the additional logic circuits of the logic cone C coupled at the output, for example. It is thus possible to furthermore detect a possible error state of one of the logic circuits of the logic cone C coupled between two TMRs under test.

In order to test at the same time the logic cone C connected to the output q of the TMR 2, once the test sequence has been loaded by the chain composed of ti and tq, the flip-flop being tested 4 is switched into a normal operating mode by applying a first zero control signal TE4 to the control input te of the first flip-flop 4. A clock edge CLK4 from the first flip-flop 4 is subsequently applied to propagate the test sequence through the additional logic circuits of the logic cone C connected to the output q of the flip-flop being tested. The second multiplexer 8 has been configured by the control signal TE81.TE82 in such a manner that its output receives the output signal Q4 from the flip-flop being tested, in the present case, the first flip-flop 4. A the end of the rising edge of the clock, a flip-flop being tested of a TMR coupled at the output of the logic cone C has acquired the value of its input d resulting from the propagation of the test sequence through the logic cone C.

The first flip-flop 4 is subsequently set back into a test mode by the application of a non-zero control signal TE4 to its control input te, and the output test signal TQ4 is subsequently analyzed by recovering it via the first multiplexer 7. For this purpose, the first multiplexer 7 receives a control signal designed to select the input coupled to the test output tq of the first flip-flop 4.

Then, at the end of the test phase, the control circuit sends a command so as to again place the TMR 2 in a normal operating mode in such a manner as to restore the state of the TMR 2 preceding the test.

The first multiplexer 7 allows the selection of the output signal to be delivered in such a manner as to transmit the signal TQ coming from the test output tq of the flip-flop 4 being tested. This obtains the result of the test operation, or to form a test chain between several similar TMRs.

By enabling the TMR on a clock edge in a normal operating mode immediately after a test mode, the majority vote circuit 3 automatically restores the value of the output signal from the TMR 2 that existed prior to the initiation of the test mode. This is due to the fact that the other two flip-flops 5 and 6 not being tested have the same value because their state has been frozen during the test mode.

The test chain thus created allows the sequence of test bits to be transmitted through the various concatenated logic components such that, at the end of the injection of a sequence of test bits, each flip-flop being tested of each logic component of the test chain is in a pre-determined state for the test.

In order to test the second flip-flop 5 of the TMR 2 and the logic cone C which is connected to its output q, a command is sent to the first additional multiplexer 9 so as to enable the transmission of the test signal TI received on the test input ti of the second flip-flop 5. The second flip-flop 5 is the only flip-flop being tested in this test mode. For this purpose, the circuit for controlling the flip-flops injects a signal for enabling the test mode TE only into the second flip-flop 5, while the other two flip-flops 4 and 6 remain in a normal operation. The logic state of the two other flip-flops 4 and 6 is frozen by disabling their clocks CLK4 and CLK6.

In the same way, in order to test the third flip-flop 6 of the TMR 2, a command is sent to the second additional multiplexer 10 so as to enable the transmission of the test signal TI received on the test input ti of the third flip-flop 6. The third flip-flop 6 is the only flip-flop being tested in this test mode. For this purpose, the circuit for controlling the flip-flops injects a signal for enabling the test mode TE only into the third flip-flop 6, with the other two flip-flops 4 and 5 remaining in a normal operation. The logic state of the other two flip-flops 4 and 6 is frozen by disabling their clocks CLK4 and CLK5.

FIG. 4 illustrates the device 1 for managing the operation of the TMR 2 in an initial test mode prior to any operation of the TMR 2 in a normal operating mode.

The control circuit is configured, prior to placing the TMR 2 in a normal operating mode, for first of all placing the TMR 2 in an initial test mode. Here the flip-flops 4 to 6 of the TMR 2 are coupled in series via their respective test input ti and test output tq in such a manner as to form a test chain of flip-flops comprising a test chain input and a test chain output.

In order to implement the test chain, a command is sent to the first additional multiplexer 9 to transmit the signal coming from the test output tq of the first flip-flop 4 to the test input ti of the second flip-flop 5. A command is also sent to the second additional multiplexer 10 to transmit the signal coming from the test output tq of the second flip-flop to the test input ti of the third flip-flop 6.

In the initial test mode, an ATPG is connected to the device 1 for managing the operation of the TMR. The ATPG then generates at least one sequence of test bits and injects it via the test circuit signal into the input of the test chain, in other words, into the test input ti of the first flip-flop 4. The test signal is then propagated in the flip-flops via the test chain.

Once the whole test sequence has been injected, the operating mode is re-engaged by applying a zero signal TE4 to TE6 to the control inputs te of the flip-flops 4 to 6 and the flip-flops 4 to 6 are operated on a clock edge in operating mode. Then, the test mode is re-engaged by applying a non-zero signal TE4 to TE6 to the control inputs te of the flip-flops 4 to 6 and the test output signals delivered by the test chain output, in other words by the test output tq of the third flip-flop 6, are analyzed.

The test sequence may comprise more than three bits in the case for example where several TMR are concatenated one after the other via their input and their test output.

The device therefore allows a test phase to be implemented during operation of the integrated circuit and the logic component is to be reset at the end of the test phase into its previous state prior to the test phase. The device also offers the possibility of implementing an initial test phase by an ATPG in a conventional manner.

That which is claimed is:

1. A method for managing operation of a logic component comprising a majority vote circuit and an odd number of flip-flops equal to at least three, with each flip-flop having a data input, a test input, a test output and a data output coupled to an input of the majority vote circuit, the method comprising:
   placing the logic component in a normal operating mode in which a same input signal is delivered to each data input of the flip-flops, and the majority vote circuit delivers an output signal;
   following the normal operating mode, placing the logic component in a test mode in which
      a flip-flop of the logic component is placed in the test mode, a test signal is injected into the test input of the flip-flop being tested,
a logic state of the other flip-flops is frozen, and
the output signal delivered by the test output of the flip-flop being tested is analyzed; and
at the end of the test mode, placing the logic component back in the normal operating mode, with the majority vote circuit restoring a value of the output signal on the data output of the logic component that existed prior to the test mode.

2. The method according to claim 1, wherein after having frozen the logic state of the other flip-flops and before analyzing the output signal delivered by the test output, further comprising:
placing the flip-flop being tested back in the normal operating mode;
controlling the logic component so that the output signal from the flip-flop being tested is delivered at the output of the logic component for testing an additional logic circuit coupled to the output of the logic component; and
placing the flip-flop being tested back in the test mode.

3. The method according to claim 2, wherein after controlling the logic component and before placing the flip-flop being tested in the test mode, further comprising applying a clock cycle to the flip-flop being tested.

4. The method according to claim 1, wherein the steps following the normal operating mode and at the end of the test mode are repeated for another flip-flop of the logic component until all the flip-flops of the logic component have been tested.

5. The method according to claim 1, further comprising, prior to placing any of the logic component in the normal operating mode:
placing the logic component in an initial test mode in which the flip-flops of the logic component are coupled in series via their test input and their respective test output so as to form a test chain of flip-flops comprising a test chain input and a test chain output;
injecting a test signal in the test chain input; and
analyzing test output signals delivered by the test chain output.

6. A method for managing operation of a logic component comprising a majority vote circuit and an odd number of flip-flops equal to at least three, with each flip-flop having a data input, a test input, a test output and a data output coupled to an input of the majority vote circuit, with the logic component being configured to operate in a normal operating mode in which a same input signal is delivered to each data input of the flip-flops, and the majority vote circuit delivers an output signal, the method comprising:
placing the logic component in a test mode comprising
placing a flip-flop of the logic component in the test mode,
injecting a test signal into the test input of the flip-flop being tested,
freezing a logic state of the other flip-flops, and
delivering the output signal by the test output of the flip-flop being tested for analyzing; and
at the end of the test mode, placing the logic component back in the normal operating mode, with the majority vote circuit restoring a value of the output signal on the data output of the logic component that existed prior to the test mode.

7. The method according to claim 6, wherein after having frozen the logic state of the other flip-flops and before analyzing the output signal delivered by the test output, further comprising:
placing the flip-flop being tested back in the normal operating mode;
controlling the logic component so that the output signal from the flip-flop being tested is delivered at the output of the logic component for testing an additional logic circuit coupled to the output of the logic component; and
placing the flip-flop being tested back in the test mode.

8. The method according to claim 7, wherein after controlling the logic component and before placing the flip-flop being tested in the test mode, further comprising applying a clock cycle to the flip-flop being tested.

9. The method according to claim 6, wherein the steps following the normal operating mode and at the end of the test mode are repeated for another flip-flop of the logic component until all the flip-flops of the logic component have been tested.

10. The method according to claim 6, further comprising, prior to placing any of the logic component in the normal operating mode:
placing the logic component in an initial test mode in which the flip-flops of the logic component are coupled in series via their test input and their respective test output so as to form a test chain of flip-flops comprising a test chain input and a test chain output;
injecting a test signal into the test chain input; and
analyzing the test output signals delivered by the test chain output.

11. An electronic device comprising:
a logic component comprising a majority vote circuit;
an odd number of flip-flops equal to at least three, with each flip-flop having a data input, a test input, a test output and a data output coupled to an input of the majority vote circuit;
a control circuit configured to
place the logic component in a normal operating mode in which a same input signal is delivered to each data input and the majority vote circuit delivers an output signal, and
following a normal operating mode, place the logic component in a test mode in which a flip-flop of the logic component is placed in a test mode, a test signal is injected in the test input of the flip-flop being tested, with the logic state of the other flip-flops being frozen, and the output signal delivered by the test output of the flip-flop being tested is to be analyzed; and
the logic component being placed back in the normal operating mode at the end of the test phase, with the majority vote circuit restoring a value of the output signal that existed prior to the initiation of the test mode onto the data output of the logic component.

12. The electronic device according to claim 11, wherein the control circuit comprises a first multiplexer receiving at its input the test output signals from the flip-flops of the logic component.

13. The electronic device according to claim 11, wherein the control circuit comprises a second multiplexer receiving at its input the data output signals from the flip-flops of the logic component and the output signal of the majority vote circuit.

14. The electronic device according to claim 11, wherein the control circuit is further configured, prior to placing the logic component in the normal operating mode, to place the logic component in an initial test mode in which the flip-flops of the logic component are coupled in series via their respective test input and test output to form a test chain of flip-flops comprising a test chain input and a test chain output, with a test signal to be injected into the test chain input, and with test output signals delivered by the test chain output to be analyzed.

15. The electronic device according to claim 14, wherein the control circuit further comprises, for placing the logic component in the initial test mode or in the test mode, an additional multiplexer for each of the flip-flops of the logic component starting from the second flip-flop, with each additional multiplexer receiving at its input the test signal and the output test signal from a flip-flop, with the test output of each flip-flop being coupled to the test input of a flip-flop distinct from the flip-flop coupled to its input such that the flip-flops of the same logic circuit can be coupled in series via their test input and their respective test output.

16. The electronic device according to claim 11, wherein the logic component comprises three flip-flops.

* * * * *